(12) United States Patent
Kitajima et al.

(10) Patent No.: US 6,344,690 B1
(45) Date of Patent: Feb. 5, 2002

(54) SEMICONDUCTOR DEVICE WITH GOLD BUMPS, AND METHOD AND APPARATUS OF PRODUCING THE SAME

(75) Inventors: Masayuki Kitajima; Masakazu Takesue; Yoshitaka Muraoka, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/691,142

(22) Filed: Oct. 19, 2000

Related U.S. Application Data

(62) Division of application No. 09/014,981, filed on Jan. 28, 1998.

(30) Foreign Application Priority Data

Sep. 8, 1997 (JP) ............................................. 9-242459

(51) Int. Cl.$^7$ ................................................ H01L 23/48
(52) U.S. Cl. ...................... 257/741; 257/737; 257/781
(58) Field of Search ................................ 257/741, 781, 257/780, 738, 737

(56) References Cited

U.S. PATENT DOCUMENTS

| 4,097,266 A | 6/1978 | Takahashi et al. | |
|---|---|---|---|
| 5,508,228 A | 4/1996 | Nolan et al. | 438/618 |
| 5,707,902 A | 1/1998 | Chang et al. | 438/614 |
| 5,833,128 A | * 11/1998 | Kloeser et al. | |
| 6,204,455 B1 | * 3/2001 | Gileo et al. | |

FOREIGN PATENT DOCUMENTS

| JP | A-57-23235 | 2/1982 |
|---|---|---|
| JP | A-57-143836 | 9/1982 |
| JP | A-57-190341 | 11/1982 |
| JP | A-63-142644 | 6/1988 |
| JP | A-63-285943 | 11/1988 |
| JP | A-63-293927 | 11/1988 |
| JP | A-2-246335 | 10/1990 |
| JP | A-3-108734 | 5/1991 |
| JP | A-4-14845 | 1/1992 |
| JP | A-4-32171 | 2/1992 |
| JP | A-4-164342 | 6/1992 |
| JP | A-4-266035 | 9/1992 |
| JP | A-4-266037 | 9/1992 |
| JP | A-5-160329 | 6/1993 |
| JP | A-5-166881 | 7/1993 |
| JP | 5-182973 | 7/1993 |
| JP | A-5-218044 | 8/1993 |
| JP | A-5-218046 | 8/1993 |
| JP | A-5-226341 | 9/1993 |
| JP | A-5-335312 | 12/1993 |
| JP | 6-120230 | 4/1994 |
| JP | 8-236529 | 4/1994 |
| JP | 409097818 A * | 4/1997 |

* cited by examiner

*Primary Examiner*—Caridad Everhart
(74) *Attorney, Agent, or Firm*—Armstrong, Westerman, Hattori, McLeland & Naughton, LLP

(57) ABSTRACT

A semiconductor device comprises a semiconductor element having electrodes and metal bumps are attached to the electrodes. The metal bumps include copper cores and gold surface layers covering the cores. In addition, the metal bumps may include gold bump elements and solder bump elements connected together.

9 Claims, 20 Drawing Sheets

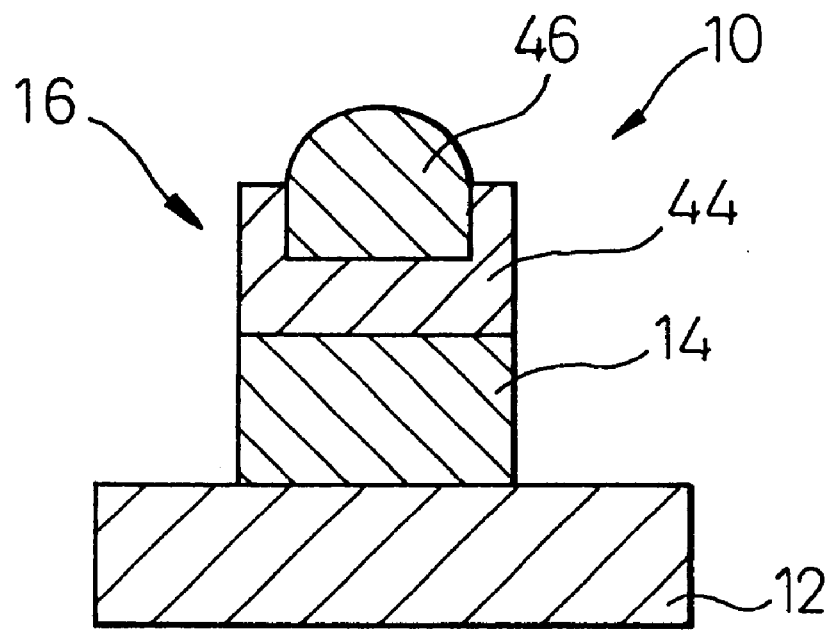

SEMICONDUCTOR DEVICE WITH GOLD BUMPS, AND METHOD AND APPARATUS OF PRODUCING THE SAME

This appln is a Div of Ser. No. 09/014,981 filed Jan. 28, 1998.

BACKGROUND OF THE INVENTION

1. Field of the Invention

The present invention relates to a semiconductor device, a method of producing the same, and an apparatus for producing the same.

2. Description of the Related Art

With the progress in semiconductor integrated circuits in recent years, semiconductor elements having very many terminals (e.g., not less than 300 terminals) have been placed in the market. Accordingly, it has been strongly demanded to improve the technology for connecting the terminals (electrodes) of a semiconductor element to the terminals (electrodes) of a wiring board, and to reduce the cost.

Technology has been developed for connecting all the electrodes of the semiconductor element to the electrodes of the wiring substrate at one time by utilizing metal bumps. That is, metal bumps such as solder bumps or gold bumps are first attached to the electrodes of the semiconductor element, and the semiconductor element is pressed onto the wiring board, with its face directed downward, so that the metal bumps are joined to the electrodes of the wiring board and the electrodes of the semiconductor element are connected to the electrodes of the wiring board.

The conductors of the integrated circuit of a semiconductor element are formed of aluminum and, hence, the electrodes of the semiconductor elements are generally formed of aluminum. On the other hand, the conductors of a wiring board are composed of copper and, hence, the electrodes of the wiring board are generally formed of copper.

When solder bumps are to be used, a nickel layer and a titanium layer are formed on the aluminum electrodes of the semiconductor element and the solder bumps are joined to the electrodes having a composite structure of the semiconductor element, since solder joins poorly to aluminum. Thereafter, the semiconductor element is pressed onto the wiring board while being heated, so the solder bumps melt and spread on the electrodes of the wiring board, with the result that the solder bumps are surely connected to the electrodes of the wiring board.

When gold bumps are to be used, there is no need to form a nickel layer and a titanium layer on the aluminum electrodes of the semiconductor element unlike the case of using the solder bumps, since gold directly joins to aluminum. However, the gold bumps are attached to the electrodes of the semiconductor element in the form of stud bumps with projections, and, the semiconductor element is pressed onto the wiring board while being heated after the surfaces of the stud bumps are levelled, an electrically conducting adhesive is applied to the surfaces of the gold bumps, so that the gold bumps are connected to the electrodes of the wiring board via the electrically conducting adhesive. The electrically conducting adhesive comprises a mixture of a thermosetting resin and a metal filler mixed therein, and is thermally cured. Thereafter, the semiconductor element and the wiring board are sealed with a sealing adhesive (insulating resin) inserted therebetween.

When solder bumps are to be used, it is necessary to add the nickel layer and the titanium layer onto the aluminum electrodes of the semiconductor element, as described above but not all users of the semiconductor elements are necessarily allowed to apply the nickel layer and the titanium layer as desired, since application of the nickel layer and the titanium layer requires a special facility such as a vacuum chamber. Therefore, the solder bumps often cannot be used when a semiconductor element without a nickel layer and a titanium layer is purchased.

When an electrically conducting adhesive is applied to the gold bumps formed as stud bumps, on the other hand, the levelled surfaces of the stud bumps are not necessarily in parallel with the surface of the wiring circuit. Therefore, electric connection is not accomplished to a sufficient degree despite using the electrically conducting adhesive, and the reliability of connection remains low. Moreover, the materials are used in increased amounts, the steps of production are complex, and the heating must be continued until the resin is cured, hindering the productivity. Besides, in the case where the semiconductor element is defective or the mounting thereof is defective, the semiconductor element must be replaced by peeling the electrically conducting adhesive off the electrodes of the wiring board. However, it is difficult to peel it off after it is once thermally cured, since the electrically conducting adhesive contains a thermosetting resin. This makes it very difficult to repair the semiconductor element or the wiring board.

SUMMARY OF THE INVENTION

The object of the present invention is to provide a semiconductor device, and a method and an apparatus for producing the same which permit a semiconductor element to be mounted to a wiring board by a face-down technique, and to provide improved reliability of connections and simplicity of replacement of the semiconductor element.

A semiconductor device, according to the first feature of the present invention, comprises a semiconductor element having electrodes, and metal bumps including cores and metal surface layers covering said cores, said metal bumps being attached to the electrodes of said semiconductor element.

In this case, preferably, the metal surface layers comprise one of gold and solder.

Moreover, the metal surface layer is a plated layer plated on said core. The core comprises one of a metal, an inorganic material and an organic material and has a diameter of not larger than 100 $\mu$m, and the metal surface layer has a thickness of not larger than 50 $\mu$m. There is further provided a wiring board having electrodes, metal bumps attached to the electrodes of said semiconductor element being connected to the electrodes of the wiring board.

A semiconductor device, according to the second feature of the present invention, comprises a semiconductor element having electrodes, and metal bumps comprising gold bump elements and solder bump elements connected together, said gold bump elements being attached to the electrodes of said semiconductor element.

In this case, preferably, the gold bump element has a first side and a second side opposite to said first side, the first side of said gold bump element being joined to the electrode of the semiconductor element, and the second side of said gold bump element is joined to said solder bump element. The second side of said gold bump element forms a flat surface or a flat surface with a recessed portion. There is further provided a wiring board having electrodes, the metal bumps being attached to the electrodes of said semiconductor element are connected to the electrodes of said wiring board.

A semiconductor device, according to the third feature of the present invention, comprises a semiconductor element having electrodes, and metal bumps comprising gold-containing solder films formed on the electrodes of said semiconductor element and metal bump elements provided on said gold-containing solder films.

In this case, preferably, there is further provided a wiring board having electrodes, the metal bumps attached to the electrodes of said semiconductor element being connected to the electrodes of said wiring board. The metal bump element comprises one of gold and solder. The metal bump element is formed as one of a metal film and a metal ball.

A method of producing a semiconductor device, according to the fourth feature of the present invention, comprises the steps of immersing a semiconductor element having electrodes in a molten gold-containing solder to form gold-containing solder films on the electrodes of said semiconductor element, and forming metal bump elements on said gold-containing solder films to thereby form metal bumps comprising said gold-containing solder films and said metal bump elements.

In this case, preferably, the step of forming the metal bump elements on said gold-containing solder films comprises immersing the gold-containing solder films in the molten solder to form solder films. The step of forming the metal bump elements on said gold-containing solder films comprises immersing the gold-containing solder films in a bath of a molten metal. The step of forming the metal bump elements on said gold-containing solder films comprises joining solid pieces onto the gold-containing solder films.

A method of producing a semiconductor device, according to the fifth feature of the present invention, comprises the steps of performing a process for imparting a fluxing action to the electrodes of the semiconductor element prior to immersing the semiconductor element having the electrodes in the molten gold-containing solder.

In this case, preferably, the process for imparting said fluxing action comprises irradiating the semiconductor element with a plasma. The step of performing the process for imparting said fluxing action comprises cleaning the electrodes of the semiconductor element with a first gas, and forming a compound of a material of the electrodes of the semiconductor element and of a second gas.

A semiconductor device, according to the sixth feature of the present invention, comprises a semiconductor element having electrodes, and metal bumps including gold bump elements having nose-like projections provided on the electrodes of said semiconductor element and solder elements formed on said gold bump elements to cover said projections.

In this case, preferably, there is further provided a wiring board having electrodes, the metal bumps attached to the electrodes of said semiconductor element being connected to the electrodes of the wiring board.

A semiconductor device, according to the seventh feature of the present invention, comprises a semiconductor element having electrodes, and metal bumps including gold bump elements provided on the electrodes of said semiconductor element and first metal layers formed around said gold bump elements to protect said gold bump elements.

In this case, preferably, the first metal layer has a melting point lower than a melting point of said gold bump element. A second metal layer is formed around said first metal layer. The second metal layer has a melting point which is lower than a melting point of said first metal layer by more than 20° C. There is further provided a wiring board having electrodes, the metal bumps attached to the electrodes of said semiconductor element being connected to the electrodes of the wiring board.

A method of producing semiconductor devices, according to the eighth feature of the present invention, comprises the steps of attaching gold bump elements to electrodes of a semiconductor element, immersing said semiconductor element in a bath containing a molten amalgam of a mixture of a metal for protecting gold and mercury to form an amalgam layer on said gold bump elements, heating said semiconductor elements to vaporize mercury in the amalgam and to form metal films on the gold bump elements to protect gold, and transferring molten solder elements to said metal films.

A method of producing semiconductor devices, according to the ninth feature of the present invention, comprises the step of attaching gold bump elements to electrodes of a semiconductor element and transferring molten solder elements to said gold bump elements in an environment containing inert gas at an oxygen concentration of not larger than 10,000 ppm.

In this case, preferably, at least one of alcohol, ketone, ester, ether and a mixture thereof is used as a fluxing agent for transferring prior to transferring the molten solder elements. The fluxing agent for transferring comprises a flux obtained by mixing a solid component thereof in an amount of not larger than 10% by weight in an alcohol.

An apparatus for producing semiconductor devices, according to the tenth feature of the present invention, comprises a booth, a molten-solder vessel arranged in said booth so that gold bump elements provided on the electrodes of a semiconductor element can be immersed in said vessel, means for supplying inert gas into said booth, and means for detecting the oxygen concentration in said booth.

In this case, preferably, provision is further made of a flux vessel for transfer disposed in said booth. There are further provided a molten-solder vessel, arranged so that gold bump elements provided on the electrodes of a semiconductor element can be immersed in said vessel, and a support structure, for hanging said semiconductor element, said support structure including a hanging mechanism comprising at least two mutually movably coupled coupling members. The above-mentioned at least two coupling members comprises members that are coupled together like a chain.

An apparatus for producing semiconductor devices, according to the eleventh feature of the present invention, comprises a molten-solder vessel arranged so that gold bump elements provided on the electrodes of a semiconductor element can be immersed in said vessel, and a support structure for hanging said semiconductor element, said support structure including a pump-type adsorption head having an open suction hole for holding the semiconductor element.

An apparatus for producing semiconductor devices, according to the twelfth feature of the present invention, comprises a molten-solder vessel arranged so that gold bump elements provided on the electrodes of a semiconductor element can be immersed in said vessel, and a support structure for hanging said semiconductor element, said support structure including a hanging mechanism comprising at least two mutually movably coupled coupling members and a pump-type adsorption head having an open suction hole for holding the semiconductor element.

BRIEF DESCRIPTION OF THE DRAWINGS

The present invention will be described in more detail in the following description of the preferred embodiments, with reference to the accompanying drawings in which:

FIG. 11 is a view illustrating a modified example of the semiconductor device of FIG. 10;

DETAILED EXPLANATION OF THE PREFERRED EMBODIMENTS

Figure 1:
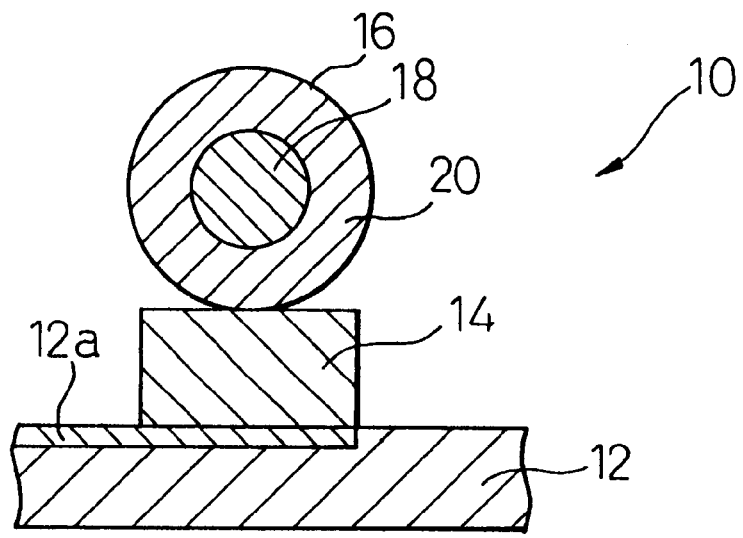
FIG. 1 is a cross-sectional view of a portion of the semiconductor device according to the first embodiment of the present invention.
Figure 2:
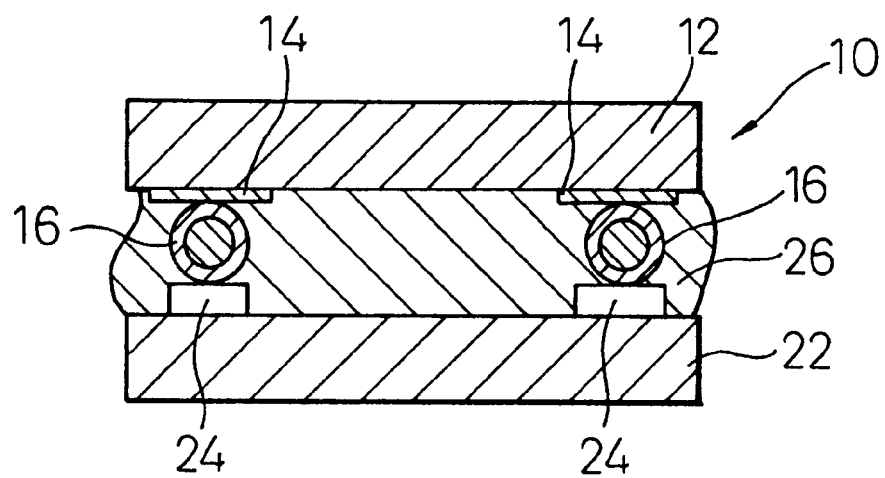
FIG. 2 is a cross-sectional view of the semiconductor element of FIG. 1 mounted to a circuit board.

FIGS. 1 and 2 show the semiconductor device according to the first embodiment of the present invention. In FIG. 1, the semiconductor device 10 comprises a semiconductor element 12 having electrodes 14 and metal bumps 16 attached to the electrodes 14.

The metal bump 16 comprises a core 18 in the form of a ball and a surface layer 20 surrounding the core 18. The semiconductor element 12 is a bare chip constituting a semiconductor integrated circuit, and includes an integrated circuit (not shown) and a conductor 12a connected to the integrated circuit. The electrode 14 is connected to the conductor 12a. Note that FIG. 1 shows one electrode 14 and one metal bump 16 only, but it is needless to say that a plurality of electrodes 14 and metal bumps 16 are provided according to the number of terminals of the semiconductor element 12. This also applies to the subsequent embodiments.

In FIG. 2, the semiconductor device 10 includes a wiring board 22 having electrodes 24, in addition to the constitution of FIG. 1. The electrodes 24 of the wiring board 22 are connected to a circuit pattern (not shown) in the wiring board 22, and are disposed in the same arrangement as the electrodes 14 of the semiconductor element 12. The metal bumps 16 attached to the electrodes 14 of the semiconductor element 12 are connected to the electrodes 24 of the wiring board 22, by pressing the semiconductor element 12 onto the wiring board 22 in a face-down bonding method while being heated. In this embodiment, the metal bumps 16 are directly joined to the electrodes 24 of the wiring board 22. It is therefore possible to remove the semiconductor element 12 from the wiring board 22 to repair it. Space between the semiconductor element 12 and the wiring board 22 is filled with an adhesive 26 for fixing. The adhesive (insulating resin) 26 for fixing can be applied to the wiring board 22 in advance as shown in FIG. 4(C) or can be charged after the semiconductor element 12 is pressed onto the wiring board 22.

The electrodes 14 of the semiconductor element 12 are made of aluminum and the electrodes 24 of the wiring board 22 are made of copper. In the embodiment of FIGS. 1 and 2, the core 18 of the metal bump 16 is made of copper and has a diameter of 100 $\mu$m, and the surface layer 20 is made of gold and has a thickness of 10 $\mu$m.

Figure 3A:
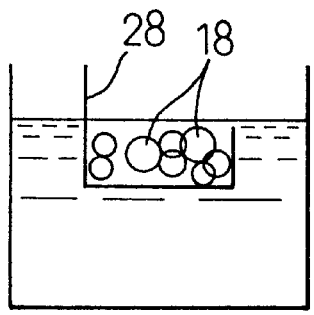
FIGS. 3A to 3D are views illustrating the process in which the surface layers around the cores are subjected to a electroless plating.
Figure 3B:
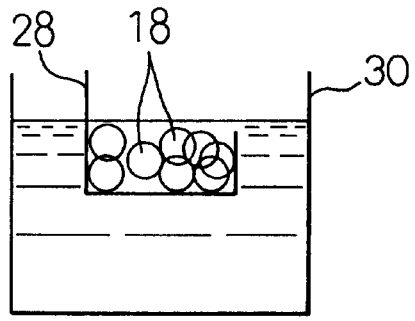
Figure 3C:
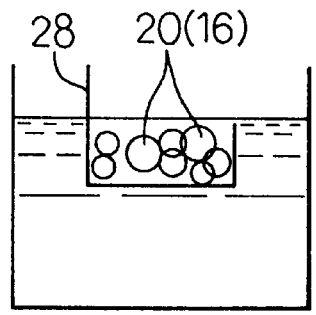
Figure 3D:
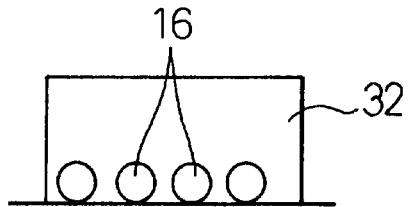

The surface layer 20 is formed around the core 18 by electroless plating, as shown in FIGS. 3A to 3D. FIG. 3A shows the step in which the copper cores 18 contained in a container 28 are washed. The washing is effected twice. The cores 18 are washed first with an aqueous solution of hydrochloric acid and then with pure water. FIG. 3B shows the step in which the cores 18 contained in the container 28 are subjected to an electroless plating in a plating vessel 30. The plating vessel 30 contains a electroless plating solution including gold. The electroless plating is suited for plating the cores 18 that are small solid pieces, since no current needs be supplied to the cores 18. FIG. 3C shows the step in which the metal bumps 16 comprising copper cores 18 plated with the gold surface layer 20 are being washed. The washing is effected twice. The metal bumps 16 are washed first with pure water and then with acetone. FIG. 3D shows the step in which the metal bumps 16 are dried with vacuum in a vacuum vessel 32. The thus formed metal bumps 16 are stored in a suitable container and are then attached to the electrodes 14 of the semiconductor element 12.

Figure 4A:
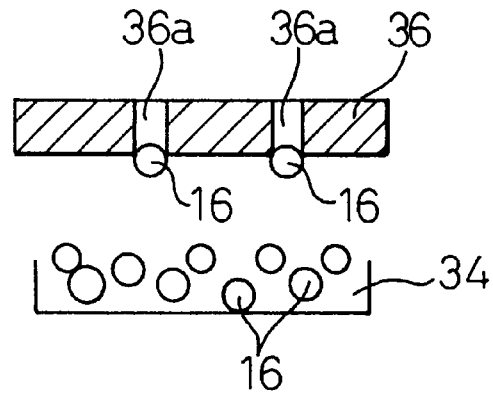
FIGS. 4A to 4C are views illustrating the process in which bumps comprising cores and surface layers are attached to the electrodes of the semiconductor element and the semiconductor element is then mounted to the wiring board.
Figure 4B:
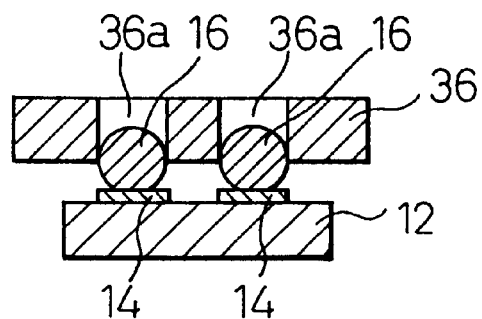
Figure 4C:
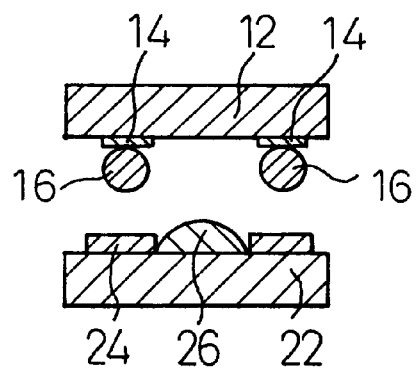

FIGS. 4A to 4C show the steps in which metal bumps 16 comprising the cores 18 and the surface layers 20 are attached to the electrodes 14 of the semiconductor element 12, and the semiconductor element 12 is then mounted to the wiring board 22. FIG. 4A illustrates the step in which the metal bumps 16 in the container 34 are attracted and held by suction holes 36a of a suction head 36. FIG. 4B illustrates the step in which the suction head 36 is pressed onto the semiconductor element 12 while being heated. The suction holes 36 a are disposed in the same arrangement as the electrodes 14 of the semiconductor element 12 and, hence, the metal bumps 16 having the gold surface layer 20 are joined to the electrodes 14 of the semiconductor element 12. When the suction head 36 is then separated from the semiconductor element 12, the metal bumps 16 are transferred to the electrodes 14 of the semiconductor element 12. This condition is shown in FIG. 1.

FIG. 4C illustrates the step in which the semiconductor element 12 is pressed onto the wiring board 22 while being heated. The metal bumps 16 attached to the electrodes 14 of the semiconductor element 12 are joined to the electrodes 24 of the wiring board 22. The adhesive 26 for fixing causes the semiconductor element 12 and the wiring board 22 to be adhered together. This condition is shown in FIG. 2.

If the shape and the size of the cores 18 of the metal bumps 16 are constant, those of the metal bumps 16 having the surface layers 20 covering the cores 18 are constant. The cores 18 in the metal bumps 16 are made of a material harder than the surface layers 20 and, hence, the metal bumps 16 are maintained in a substantially constant shape. The surface layers 20 are soft and they extend along the electrodes 24 when they are joined to the electrodes 24 of the wiring board 22 to thereby assure a sufficient contact area for the electrodes 24 and to accomplish good electric connection. The core 18 is preferably made of a material into which copper or aluminum, which is the material of the electrodes, diffuses less than it does into the surface layer 20, to thereby prevent the metal bump 16 from being alloy and from becoming brittle. The surface layer 20 is preferably made of a material into which the material for the electrode easily diffuses, so that an alloy layer is formed in the joined portion between the electrode and the metal bump to thereby realize a mechanically and electrically favorable connection.

It is preferable that the cores 18 are formed in the form of the balls having a diameter of not larger than 100 $\mu$m and the surface layers 20 have a thickness of not larger than 50 $\mu$m. The cores 18 may be formed of a metal other than copper, such as nickel, silver or bismuth. Or, the cores 18 may be formed of a ball of an inorganic material such as alumina or silica, or of an organic material such as PTFE or nylon. The surface layers 20 may be formed of gold or a metal comprising gold and other elements added to gold. In the above-mentioned embodiment, the surface layer 20 are formed by electroless plating to cover the core 18. However, the surface layers 20 may be formed by electrolytic plating or hot dipping.

Figure 5:
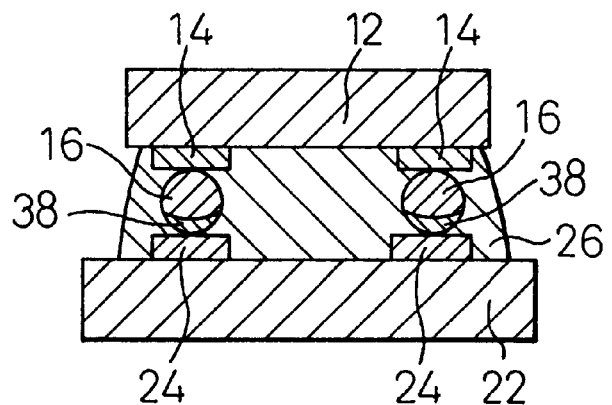
FIG. 5 is a view illustrating a modified example of the semiconductor device of FIG. 2.
Figure 6:
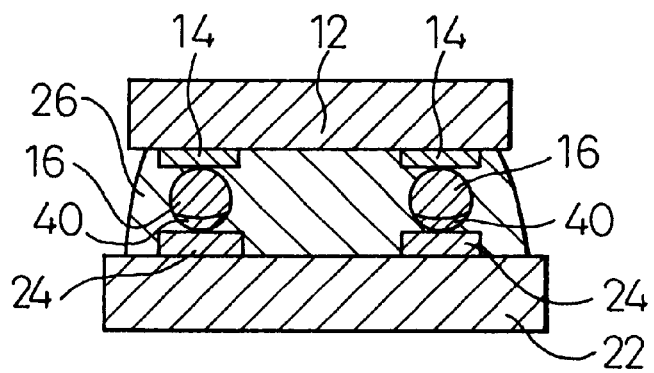
FIG. 6 is a view illustrating another modified example of the semiconductor device of FIG. 2.

FIGS. 5 and 6 illustrate modified examples of the semiconductor device of FIG. 2. The example of FIG. 5 is the same as the example of FIG. 2 except that an electrically conducting adhesive 38 is interposed between the metal bumps 16 and the electrodes 24 of the wiring board 22. The electrically conducting adhesive 38 comprises a thermosetting resin and a metal filler (gold, silver, palladium, etc.) mixed therein, and is thermally cured.

The example of FIG. 6 is the same as the example of FIG. 2 except that a solder layer 40 is interposed between the metal bumps 16 and the electrodes 24 of the wiring board 22. Even when the solder layer 40 is being formed, it is possible to remove the semiconductor element 12 from the wiring board 22 to repair it.

Figure 7:
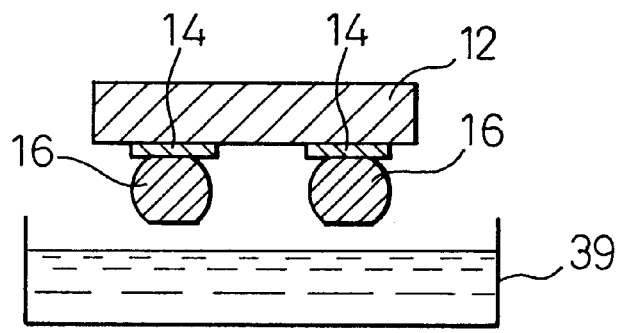
FIG. 7 is a view illustrating how to apply an electrically conducting adhesive to the surfaces of the metal bumps attached to the electrodes of the semiconductor element.

FIG. 7 illustrates an example in which the electrically conducting adhesive 38 (FIG. 5) is applied to the surfaces of the metal bumps 16 mounted on the electrodes 14 of the semiconductor element 12. The metal bumps 16 are pressed onto a glass plate or the like to flatten or level the surfaces of the metal bumps 16, and the ends of the metal bumps 16 are then immersed in the electrically conducting adhesive in the electrically conducting adhesive vessel 39, to thereby apply the electrically conducting adhesive 38 onto the surfaces of the metal bumps 16. Thus, the metal bumps 16 to which the electrically conducting adhesive 38 is applied are connected to the electrodes 24 of the wiring board 22.

Figure 8:
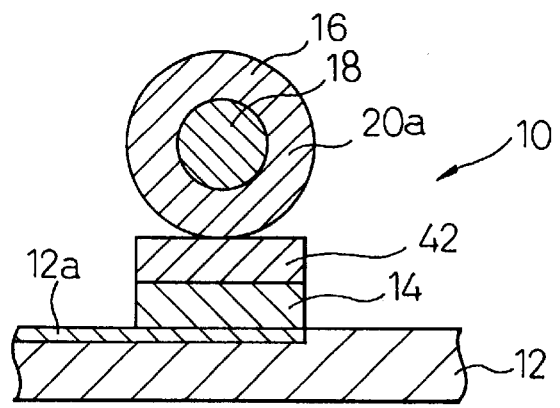
FIG. 8 is a cross-sectional view of the semiconductor device according to the second embodiment of the present invention.
Figure 9:
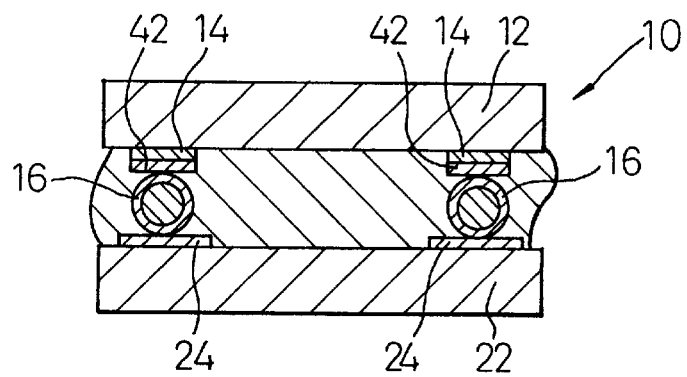
FIG. 9 is a cross-sectional view of the semiconductor element of FIG. 8 mounted to the circuit board.

FIGS. 8 and 9 illustrate the semiconductor device according to the second embodiment of the present invention. Like in the embodiment of FIGS. 1 and 2, the semiconductor device 10 according to this embodiment comprises a semiconductor element 12 having electrodes 14, metal bumps 16 attached to the electrodes 14, and a wiring board 22 having electrodes 24. The metal bump 16 comprises a spherical core 18 and a surface layer 20a covering the core 18.

In this embodiment, the electrodes 14 of the semiconductor element 12 are formed of aluminum, and a solder-plated layer 42 is formed thereon. The electrodes 24 of the wiring board 22 are formed of copper. The core 18 of the metal bump 16 is formed of copper and has a diameter of 100 $\mu$m, and the surface layer 20a is formed of a solder and has a thickness of 10 $\mu$m. The solder surface layer 20a is formed by electroless plating like the gold surface layer 20.

The metal bumps 16 having the solder surface layer 20a can be easily joined to the electrodes 14 having the solder-plated layer 42, by using the suction head 36 shown in FIG. 4. Unlike the nickel layer or the titanium layer, the solder-plated layer 42 can be formed relatively easily. Upon pressing the semiconductor element 12 onto the wiring board 22 while being heated, the metal bumps 16 attached to the electrodes 14 of the semiconductor element 12 are easily joined to the electrodes 24 of the wiring board 22.

In this case too, if the shape and the size of the cores 18 of the metal bump 16 are constant, those of the metal bumps 16 having the surface layers 20a covering the cores 18 are constant. The cores 18 in the metal bump 16 are made of a material harder than the surface layers 20a and, hence, the metal bumps 16 can maintain a substantially predetermined shape. The surface layers 20a are soft, and extend along the electrode 24 when they are joined to the electrodes 24 of the wiring board 22, to assure a sufficient contact area for the electrodes 24 and to accomplish a favorable electrical connection.

The core 18 has a diameter which is not larger than 100 $\mu$m, and can be made of a ball of a metal other than copper such as nickel, silver or bismuth, or of an inorganic material such as alumina or silica, or of an organic material such as PTFE or nylon. The surface layer 20a has a thickness of not larger than 50 $\mu$m, and can be formed not only by electroless plating, but also by electrolytic plating or hot dipping. The solder forming the surface layer 20a is a brazing material comprising a single metal or an alloy having a melting point of not higher than 400° C., and can be selected, for example, from Sn—Bi—Ag, Sn—In, In, and the like.

Figure 10:
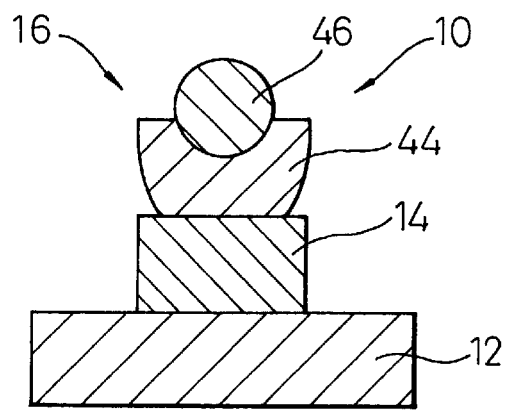
FIG. 10 is a cross-sectional view of the semiconductor device according to the third embodiment of the present invention.

FIG. 10 illustrates the semiconductor device according to the third embodiment of the present invention. The semiconductor device 10 comprises a semiconductor element 12 having electrodes 14, and metal bumps 16 comprising gold bump elements 44 and solder bump elements 46 that are connected together, the gold bump elements 44 being attached to the electrodes 14 of the semiconductor element 12. As in the embodiment of FIGS. 2, 5 and 6, it is obvious that the semiconductor device 10 may include the wiring board 22 that is attached to the semiconductor element 12 via the metal bumps 16. The wiring board 22 has electrodes 24 to be connected to the electrodes 14 of the semiconductor element 12. In this and the subsequent embodiments, even when the wiring board 22 is not shown, it should be noted that the semiconductor device 10 includes the wiring board 22 as in the embodiment of FIGS. 2, 5 and 6.

In FIG. 10, the gold bump elements 44 are formed approximately in a semi-spherical shape, and have a recessed portion formed in the flat surfaces thereof. The spherical side of the gold bump element 44 is joined to the electrode 14 of the semiconductor element 12, and the flat surface side of the gold bump element 44 is joined to the solder bump element 46. That is, the ball-like solder bump element 46 is fitted to the recessed portion in the flat surface of the gold bump element 44.

According to this constitution, the gold bump elements 44 can be easily joined to the electrodes 14 of the semiconductor element 12, and the solder bump elements 46 can be easily joined to the electrodes 24 of the wiring board 22. It is further allowed to precisely control the amount of the solder bump elements 46 so that they can be reliably joined to the electrodes 24 of the wiring board 22. The solder bump elements 46 are composed of a brazing material of a single metal or an alloy having a melting point of not higher than 400° C., and is selected, for example, from Sn—Bi—Ag, Sn—In, In, and the like. The solder bump elements 46 may have a diameter of not larger than 100 $\mu$m.

Figure 12A:
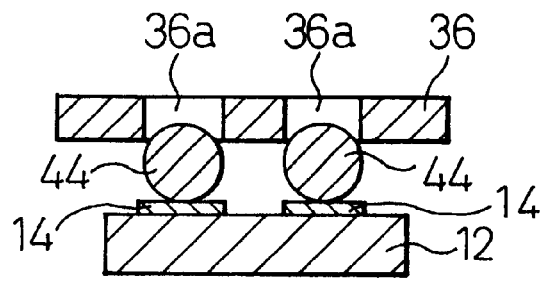
FIGS. 12A to 12C are views illustrating the process for producing the semiconductor device of FIG. 10.
Figure 12B:
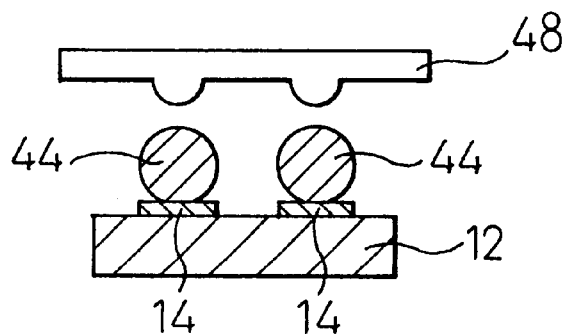
Figure 12C:
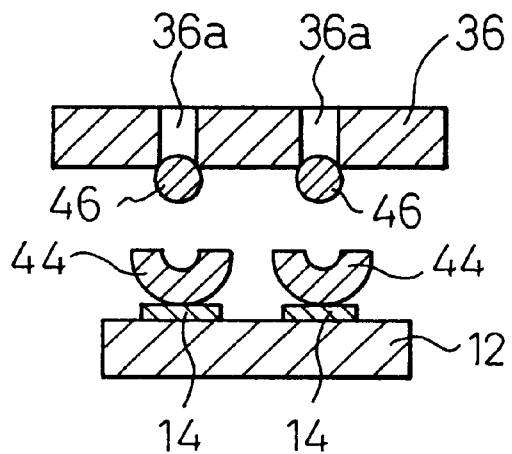

FIGS. 12A to 12C illustrate the steps for producing the semiconductor device 10 of FIG. 10. In FIG. 12A, ball-like gold bump elements 44 are prepared and attached and held by the suction head 36, which is similar to the suction head 36 of FIG. 4. The ball-like gold bump elements 44 held by the suction head 36 are transferred to the electrodes 14 of the semiconductor element 12. In FIG. 12B, a tool 48 is used for flattening the gold bump elements 44 and for forming recessed portions. The tool 48 has a surface shape corresponding to the flat surfaces and the recessed portions of the gold bump elements 44. The tool 48 is pressed onto the gold bump elements 44 attached to the electrodes 14 of the semiconductor element 12. Referring to FIG. 12C, the gold bump elements 44 have a shape with a flat surface and a recessed portion. By using the suction head 36, the solder bump elements 46 held by the suction head 36 are transferred and adhered to the recessed portions of the gold bump elements 44.

FIG. 11 illustrates a modified example of the semiconductor device of FIG. 10. The semiconductor device 10 comprises a semiconductor element 12 having electrodes 14, and metal bumps 16 comprising gold bump elements 44 and solder bump elements 46 that are connected together, the gold bump elements 44 being attached to the electrodes 14 of the semiconductor element 12. In this example, the shape of the gold bump elements 44 and the solder bump elements 46 is varied. The gold bump elements 44 are formed in a cylindrical shape and have a recessed portion formed in the flat surfaces thereof. The solder bump elements 46 are formed in a semi-circular shape, and portions including flat surfaces are fitted in the recessed portions formed in the flat surfaces of the gold bump elements 44.

The shape of the gold bump elements 44 and the solder bump elements 46 is not limited to those Illustrated in the drawings. For example, the gold bump elements 44 can be formed in the shape of a flat plate. The solder bump elements 46 may be formed as pellets of various shapes. The solder bump elements may be attached to the gold bump elements 44 by melt immersion transfer or vaporization.

Figure 13A:
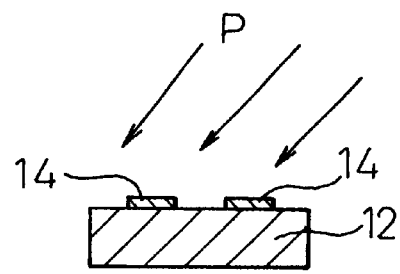
FIGS. 13A to 13D are views illustrating the semiconductor device according to the fourth embodiment of the present invention.

FIGS. 13A to 13D illustrate the semiconductor device according to the fourth embodiment of the present invention. In this embodiment, the semiconductor element 12 having electrodes 14 is irradiated with plasma P, as shown in FIG. 13A. First, the semiconductor element is irradiated with the plasma for 5 minutes while oxygen ($O_2$) is supplied. Thus, impurities such as carbon and the like are removed from the surfaces of the electrodes 14. Then, the semiconductor element is irradiated with the plasma for 5 minutes while argon (Ar) is supplied. Thus, the surface oxide films are removed from the electrodes 14. The semiconductor element is then irradiated with the plasma for 5 minutes while supplying $CF_4$. Thus, a compound of aluminum and fluorine is formed on the surfaces of the electrodes 14, this compound working as a flux for the solder. During this period, an electric power of 10 watts is supplied. Instead of this processing, the electrodes 14 may be coated with a fluxing agent (organic acid, halogen-containing compound, etc.).

Figure 13B:
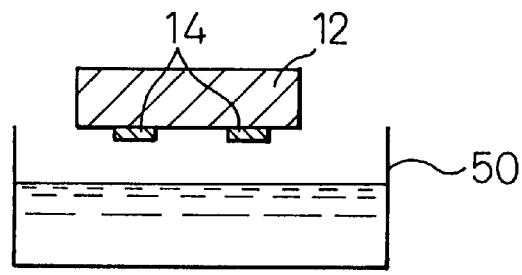
Figure 13C:
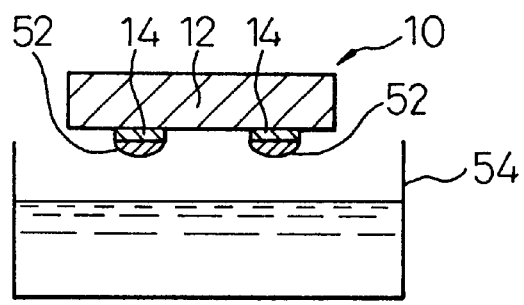

Referring to FIG. 13B, the semiconductor element 12 is immersed in a gold-containing solder vessel 50 which contains a molten gold-containing solder. The gold-containing solder is an alloy obtained by adding one or more elements to gold and has a melting point of not higher than 400° C., and is selected from, for example, Au—Sn, Au—Ge, Au—Si, and the like. This embodiment uses an Au-20%Sn solder. Then, as shown in FIG. 13C, gold-containing solder films 52 are formed on the electrodes 14 of the semiconductor element 12. The gold-containing solder films 52 are on the aluminum electrodes 14 and have a property in which they are easily wetted by the solder.

Figure 13D:
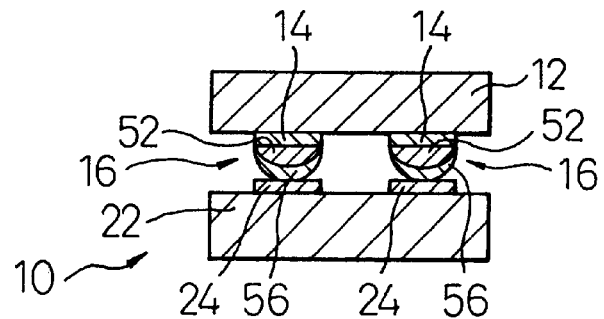

Referring to FIG. 13C, the semiconductor element 12 is immersed in a solder vessel 54 which contains a molten solder having a low melting point. This embodiment uses a bath of a low-melting molten Sn—Bi-1%Ag solder. Then, as shown in FIG. 13D, solder elements 56 are formed on the gold-containing solder films 52 on the electrodes 14 of the semiconductor element 12. The solder elements 56 are films of solder. The solder elements 56 may be formed by vaporization. Thus, the metal bumps 16 are formed by the gold-containing solder films 52 and the solder elements 56.

Then, as shown in FIG. 13D, the semiconductor element 12 is pressed onto the wiring board 22 while being heated by the face-down bonding method, so that the metal bumps 16 attached to the electrodes 14 of the semiconductor element 12 are easily joined to the electrodes 24 of the wiring board 22.

Figure 14A:
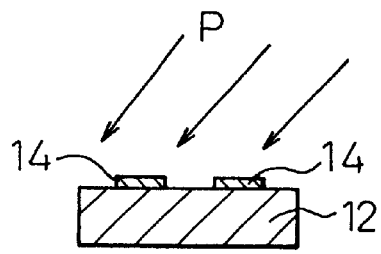
FIGS. 14A to 14D are views illustrating a modified example of the semiconductor device of FIGS. 13A to 13D.
Figure 14B:
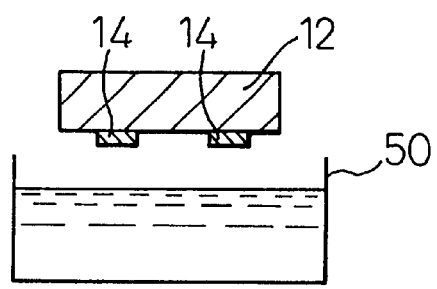
Figure 14C:
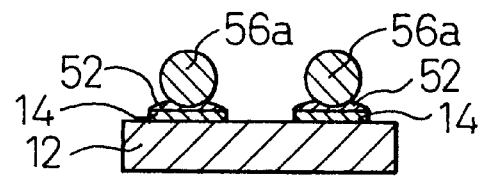

FIGS. 14A to 14D illustrate a modified example of the semiconductor device of FIGS. 13A to 13D. Referring to FIG. 14A, the semiconductor element 12 having electrodes 14 is irradiated with a plasma P while oxygen, argon and $CF_4$ are supplied. Referring to FIG. 14B, the semiconductor element 12 is immersed in the gold-containing solder vessel 50. Then, as shown in FIG. 14C, gold-containing solder films 52 are formed on the electrodes 14 of the semiconductor element 12. In FIG. 14C, solder elements 56 a are formed on the gold-containing solder films 52 on the electrodes 14 of the semiconductor element 12.

Figure 14D:
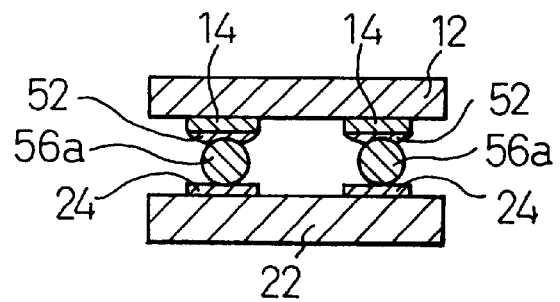

The solder elements 56a are solder balls which can be transferred by using, for example, the suction head 36 of FIG. 4. Here, the solder elements 56 a are not limited to the solder balls but may assume any form. Thus, the metal bumps 16 are formed by the gold-containing solder film 52 and the solder elements 56a. Referring to FIG. 14D, the semiconductor element 12 is then pressed onto the wiring board 22 while being heated by the face-down bonding method, whereby the metal bumps 16 attached to the electrodes 14 of the semiconductor element 12 are easily joined to the electrodes 24 of the wiring board 22.

In FIGS. 13 and 14, the solder elements 56, 56a are formed on the gold-containing solder films 52. It is, however, also possible to use a gold film, gold balls or any other bump elements instead of the solder elements 56, 56a.

Figure 15:
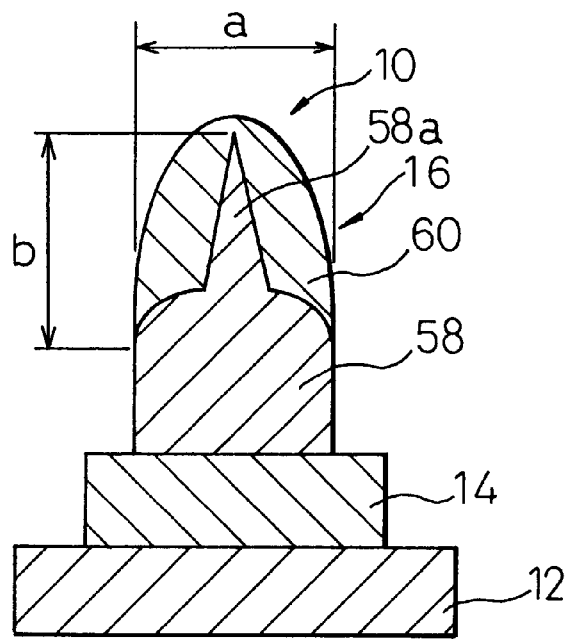
FIG. 15 is a cross-sectional view of the semiconductor device according to the fifth embodiment of the present invention.

FIG. 15 illustrates the semiconductor device according to the fifth embodiment of the present invention. In this embodiment, the semiconductor device 10 comprises a semiconductor element 12 having electrodes 14, and metal bumps 16, including gold bump elements 58, having nose-like projections 58a formed on the electrodes 14 of the semiconductor element 12 and solder elements 60 formed on the gold bump elements 58 so as to cover the projections 58a. This semiconductor device 10 may also include the wiring board 22 having electrodes 24 to which the metal bumps 16 will be connected, similar to that of the aforementioned embodiments.

Gold bump elements 58 known as stud bumps have been obtained by bonding a gold wire onto the electrodes 14 by using a capillary. The solder elements 60 are formed by immersing the gold bump elements in a molten solder. Thus, the metal bumps 16 are obtained having the solder elements 60 added to the conventional stud bumps. The solder elements 60 are joined to the electrodes 24 of the wiring board 22 without forming gap. Desirably, the bottom of the gold bump elements 58 has a diameter "a" equal to the height "b" of the gold bump elements 58, and the solder elements 60 are adhered up to the tip of nose-like projection of the gold bump elements 58.

Figure 16:
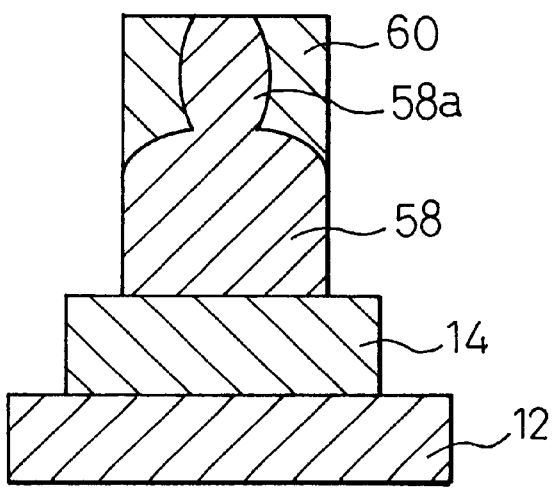
FIG. 16 is a view of the metal bump of FIG. 15 when the end thereof is flattened.

FIG. 16 illustrates the metal bump where the tip of the metal bump 16 of FIG. 15 is pressed onto a flat surface such as of a glass plate and is flattened. The metal bump 16 can be attached in this state to the electrode 24 of the wiring board 22.

Figure 17:
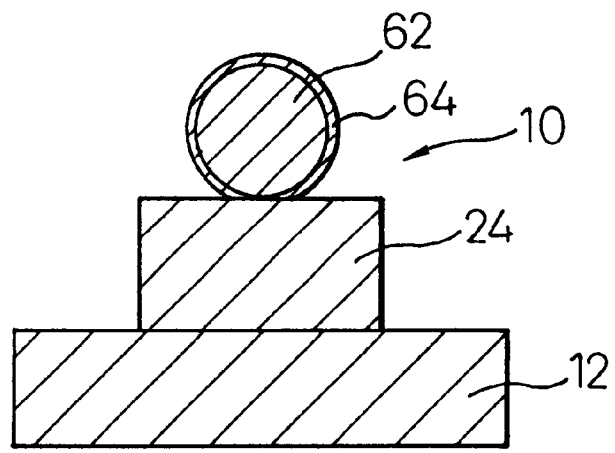
FIG. 17 is a cross-sectional view of the semiconductor device according to the sixth embodiment of the present invention.

FIG. 17 illustrates the semiconductor device according to the sixth embodiment of the present invention. In this embodiment, the semiconductor device 10 comprises a semiconductor element 12 having electrodes 14, and metal bumps 16, including gold bump elements 62, provided on the electrodes 14 of the semiconductor element 12 and a first metal layers 64 covering the gold bump elements 62 to protect the gold bump elements 62.

It is desirable that the first metal layers 64 are composed of a solder having a property for suppressing the diffusion of gold. As described earlier, the solder is a brazing material of a single metal or an alloy having a melting point which is not higher than 400° C. The solder suited for suppressing the diffusion of gold may be indium (In, m.p., 280° C.), an Au-20%Sn alloy (m.p., 280° C.) or the like.

The first metal layer 64 may be composed of a barrier metal which reacts poorly with gold. Examples of the metal that reacts poorly with gold include Bi, Ni, Zn, Cd, Cr, Ge, Ga and the like. Thus, by providing the first metal layer 64 to surround the gold bump elements 62, the metal bump elements 62 work stably for extended periods of time, and the metal bumps 16 exhibit improved reliability.

Figure 18:
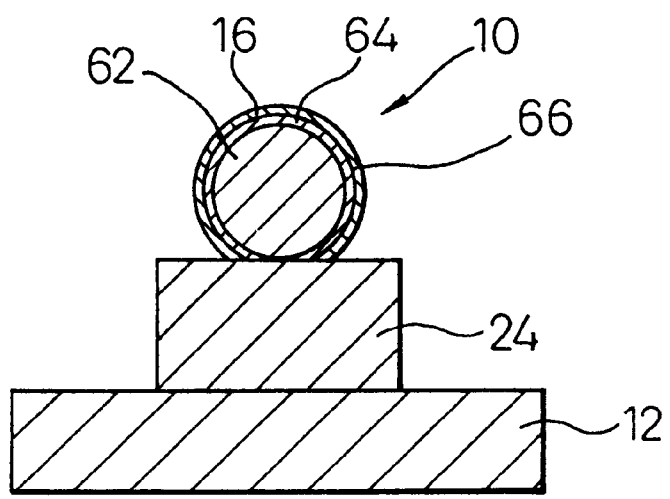
FIG. 18 is a cross-sectional view of the semiconductor device according to the seventh embodiment of the present invention.

FIG. 18 illustrates the semiconductor device according to the seventh embodiment of the present invention. In this embodiment, second metal layers 66 are further provided to cover the first metal layers 64 of FIG. 17. The first metal layers 64 work to protect the gold bump elements 62, whereas the second metal layers 66 are composed of a solder that can easily wet copper. When the semiconductor element 12 is mounted to the wiring board 22, therefore, the second metal layers 66 are more reliably joined to the copper electrodes 24 of the wiring board 22.

The combinations of the first metal layers 64 having a property for suppressing the diffusion of gold and the second metal layer 66 that can easily wet copper are described in the following example 1.

EXAMPLE 1

| Combinations | (a) | (b) | (c) | (d) |
|---|---|---|---|---|
| First metal layer 64 | In | In | Au-20% Sn | In |
| Second metal layer 66 | In—Sn | Sn—Bi-1% Ag | Sn—Bi-1% Ag | In—Ag |

The combinations of the first metal layers 64 having poor reactivity with gold and the second metal layers 66 that can easily wet copper are described in the following example 2.

EXAMPLE 2

| Combinations | (a) | (b) |
|---|---|---|
| First metal layer 64 | Bi | Ni |
| Second metal layer 66 | In—Sn | Sn—Pb—In |

In these examples, indium has a melting point of 157° C., Au-20%Sn has a melting point of 280° C., In-Sn eutectic crystal has a melting point of 117° C., Sn—Bi-1%Ag has a melting point of 139° C., and Sn—Pb—In has a melting point of 162° C. Bi and Ni have thicknesses of about 5000 angstroms. The tin described in the following Example 3 has a melting point of 232° C.

In addition, the first metal layer 64 and the second metal layer 66 can be formed by a melting-transferring. In this case, it is desired that the melting point of the second metal layer 66 is lower than the melting point of the first metal layer 64 by more than 20° C. When the temperature difference is not larger than 20° C., the first metal layer 64 and the second metal layer 66 are melted in the molten vessel at the time of melting-transferring of the second metal layer 66, and the second metal layer 66 is not properly transferred onto the first metal layer 64. Example 3 satisfies these conditions.

EXAMPLE 3

| Combinations | (a) | (b) |
| --- | --- | --- |
| First metal layer 64 | In | Sn |
| Second metal layer 66 | In—Sn | Sn—Pb—In |
| Difference in m.p. | 40° C. | 70° C. |

FIGS. 19A to 19D illustrate an eighth embodiment of the present invention. The semiconductor device 10 has, like the above-mentioned embodiment, metal bumps comprising gold bump elements 62, first metal layers 70 and second metal layers 74. This embodiment is concerned with a method of producing the semiconductor device of this type.

Figure 19A:
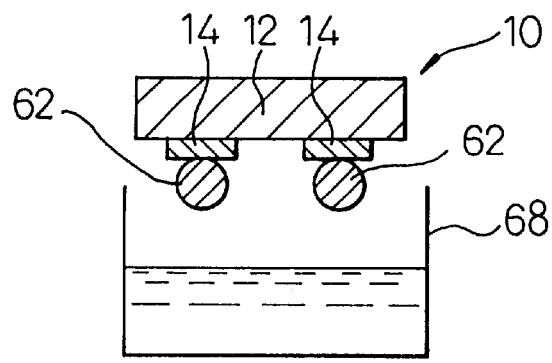
FIGS. 19A to 19D are views illustrating the semiconductor device according to the eighth embodiment of the present invention.

In FIG. 19A, the gold bumps 62 are attached to the electrodes 14 of the semiconductor element 12, and the semiconductor element 12 is immersed in the vessel 68 containing a molten amalgam comprising a mixture of a metal for protecting gold and mercury, in order to form an amalgam layer. Here, silver, that poorly reacts with gold, is selected as a metal for protecting gold. Silver and mercury are mixed together to form an amalgam (Hg+Ag).

Figure 19B:
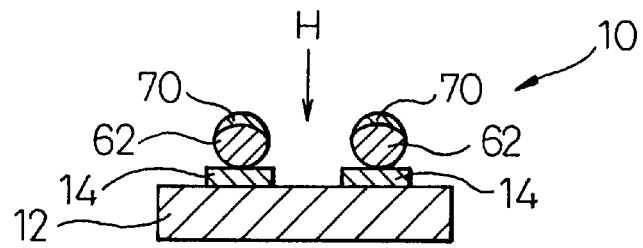
Figure 19C:
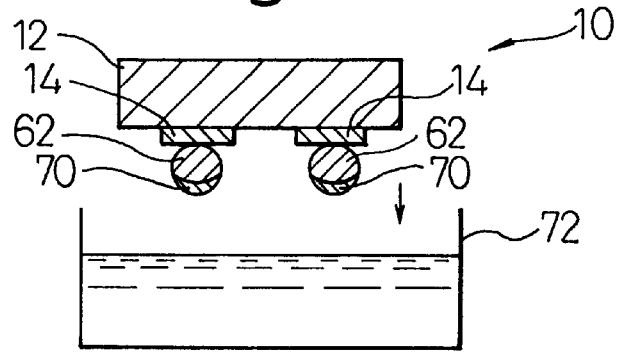
Figure 19D:
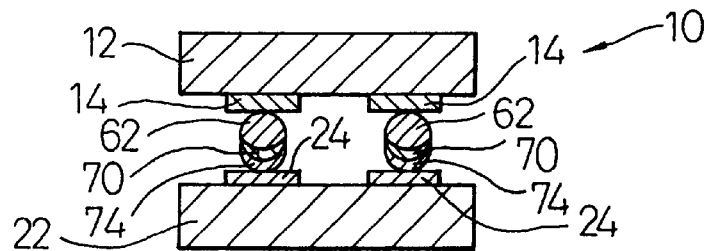

In FIG. 19B, the semiconductor element 12 is heated to vaporize mercury in the amalgam (Hg+Au) to thereby form gold films 70 on the gold bump elements 62 to protect the gold. In FIG. 19C, the semiconductor element 12 is immersed in a vessel 72 containing a molten solder. As shown in FIG. 19D, therefore, the solder elements 74 are melted and transferred onto the metal film 70. By using the thus formed metal bumps, the semiconductor element 12 is mounted on the wiring board 22.

Figure 20:
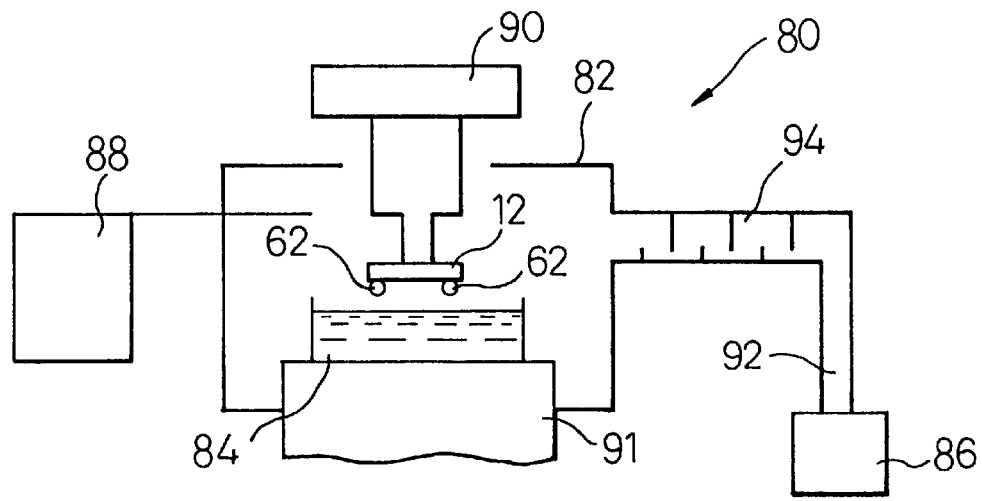
FIG. 20 is a view illustrating the apparatus for producing semiconductor devices according to the ninth embodiment of the present invention.

FIG. 20 illustrates the ninth embodiment of the present invention. This embodiment illustrates an apparatus and a method for producing semiconductor devices and, particularly, a melting-transferring apparatus used for melting and transferring solder films onto the gold bump elements 62 in the apparatus for producing semiconductor devices in the embodiments described above.

The apparatus 80 for producing semiconductor devices comprises a booth 82, a molten-solder vessel 84 in which the gold bump elements 62 provided on the electrodes of the semiconductor element 12 can be immersed, means 86 for supplying an inert gas into the booth 82, and means 88 for detecting the oxygen concentration in the booth 82. The semiconductor element 12 is supported in the booth 80 by a suction support device 90. The suction support device 90 includes a heater and has a function for conveying the semiconductor element 12. The molten-solder vessel 84 is placed on a table 91 which includes a heater.

Means 86 for supplying an inert gas is connected to the booth 82 through a duct 92 which is provided with a gas-pressure buffer tube 94. Nitrogen gas or Argon gas is used as the inert gas. The oxygen concentration in the booth 82 decreases as the inert gas is introduced into the booth 82. The oxygen concentration detecting means 88 detects the oxygen concentration in the booth 82. The molten solder in the molten-solder vessel 84 is melted and transferred onto the gold bump elements 62 in an environment where the detected oxygen concentration that is lower than 10000 ppm.

The molten solder in the molten-solder vessel 84 is melted and transferred to the gold bump elements 62 in the environment in which the oxygen concentration is not higher than 10000 ppm, as described above, so that the solder films having an approximately uniform thickness are formed on the gold bump elements 62. If the oxygen concentration is higher, the molten solder is oxidized, the surface of the solder is solidified, and it becomes no longer possible to form solder films having a uniform thickness on the gold bump elements 62. It is, therefore, desired that the molten solder in the molten-solder vessel 84 is melted and transferred onto the gold bump elements 62 in the environment in which the oxygen concentration is not higher than 10000 ppm.

It is further desirable to use at least one of alcohol, ketone, ester, ether or a mixture thereof as a flux for transfer prior to melting and transferring the molten solder onto the gold bump elements 62. The flux may have a low viscosity or a high viscosity. As the flux material for transfer, the following can be used. An alcohol such as methanol, ethanol, propanol, isopropanol, butanol, or polyethylene glycol (m.w. 400); a ketone such as acetone, dimethyl ketone, or ethyl methyl ketone; an ester such as ethylene glycol monoacetate, ethylene glycol diacetate, propylene glycol monoacetate or propylene glycol diacetate; or an ether such as ethylene glycol dimethyl ether, ethylene glycol diethyl ether, ethylene glycol dibutyl ether, or diethylene glycol dimethyl ether.

The combinations that can be used are as follows.

(a) 100% by weight of ethanol.

(b) Ethanol residue+0.2% by weight of polyethylene glycol.

(c) Isopropanol residue+0.2% by weight of polyethylene glycol.

(d) Isopropanol residue+0.2% by weight of polyethylene glycol dibutyl ether.

The above-mentioned fluxing agents contain no solid component such as rosin. It is, however, desirable to mix a solid component such as rosin in an amount of not larger than 10% by weight in an alcohol.

(a) Ethanol residue+2% by weight of hydrogenated rosin (Rika Hercules, Foral AX).

(b) Isopropanol residue+0.2% by weight of hydrogenated rosin (Rika Hercules, Foral AX).

(c) Isopropanol residue+1.0% by weight of polymerized rosin (Arakawa Kagaku, Dimerex).

(d) Isopropanol residue+1.0% by weight of gum rosin (Harima Kasei).

Figure 21:
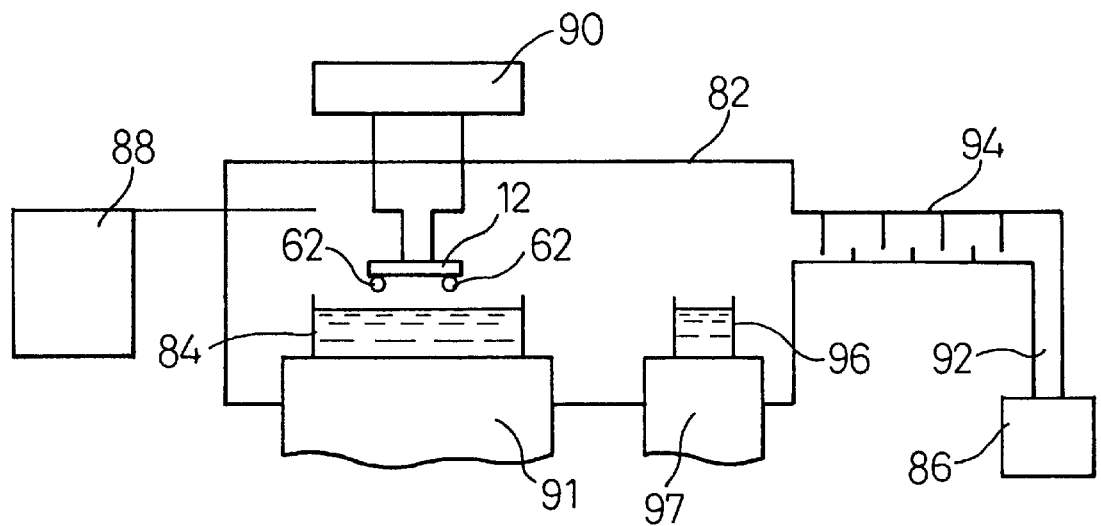
FIG. 21 is a view illustrating the apparatus for producing semiconductor devices according to the tenth embodiment of the present invention.

FIG. 21 illustrates the tenth embodiment of the present invention. This embodiment is the same as the embodiment of FIG. 20 except that a fluxing agent vessel 96 is provided in the booth 82. The fluxing agent vessel 96 is supported by a table 97. It is desired that the above-mentioned fluxing agent is applied in the booth 82, as shown in FIG. 21.

Figure 22:
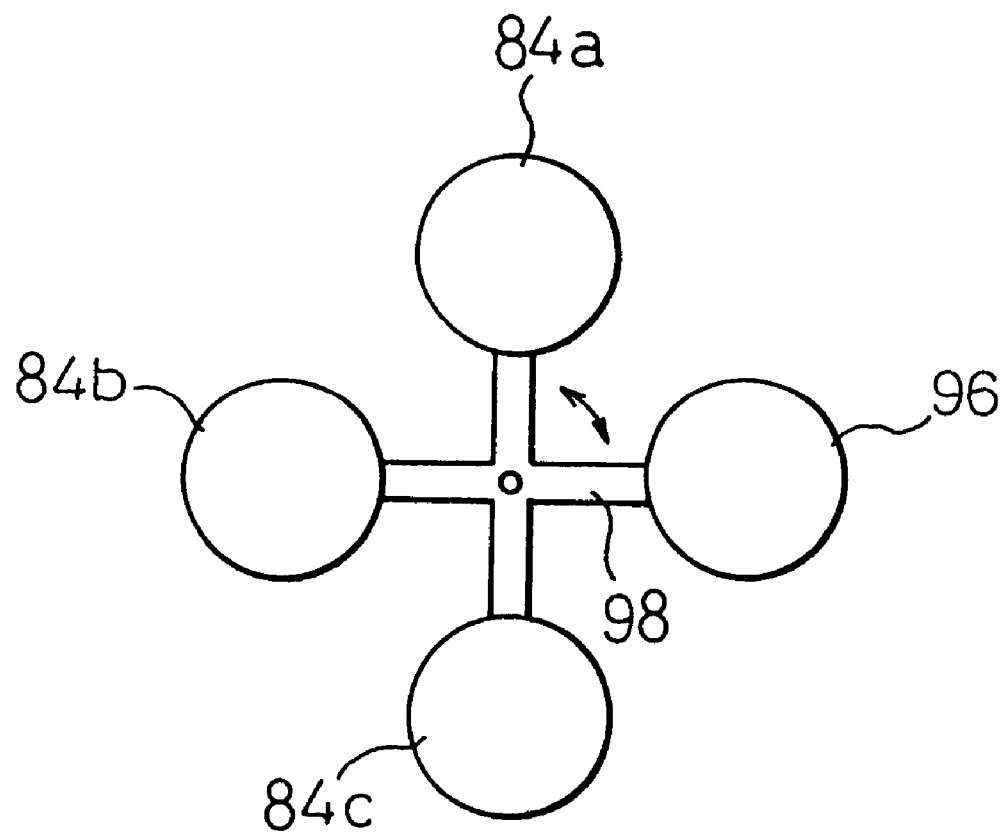
FIG. 22 is a view illustrating an example in which the apparatus of FIG. 21 includes a plurality of molten-solder vessels and a fluxing agent vessel in the booth.

FIG. 22 illustrates an example in which a plurality of molten-solder vessels 84a, 84b, 84c and a fluxing agent vessel 96 are arranged in the booth 82 in the apparatus of FIG. 21. These molten-solder vessels 84a, 84b, 84c and the fluxing agent vessel 96 are placed on a rotary pallet 98, so that any one of them is positioned under the semiconductor element 12 supported by the suction support device 90. By this arrangement, plural kinds of solders can be successively transferred.

Figure 23:
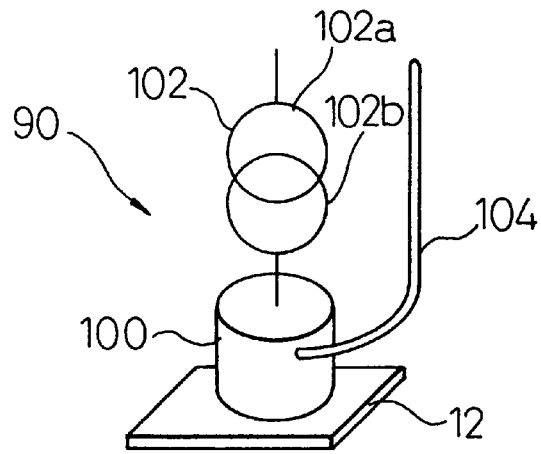
FIG. 23 is a view illustrating a feature of the suction support device in the apparatuses of FIGS. 20 and 21.

FIG. 23 illustrates a feature of the suction support device 90 in the apparatuses of FIGS. 20 and 21. The suction support device 90 includes a suction head 100 for supporting the semiconductor element 12 by a vacuum, and a hanging mechanism 102 capable of holding the semiconductor element 12 via the suction head 100. The suction head 100 is evacuated through a vacuum hose 104, and suction grooves are formed in the surface of the suction head 100, so that the semiconductor element 12 is supported by the vacuum. The hanging mechanism 102 is mounted on a conveyer means that is not shown.

The hanging mechanism 102 comprises at least two mutually movably connected coupling members 102a and 102b. The coupling members 102a and 102b comprise two members coupled together as in a chain.

In FIGS. 20 and 21, when the semiconductor element 12 is lowered toward the molten-solder vessel 84 so as to be immersed therein, the coupling members 102a and 102b of the hanging mechanism 102 are in contact with each other in a supporting relationship. As the semiconductor element 12 is lowered, the gold bump elements 62 are immersed in the molten-solder vessel 84 and the lower surface of the semiconductor element 12 is then immersed in the molten solder in the molten-solder vessel 84.

As the hanging mechanism 102 is further lowered, the coupling members 102a and 102b can mutually, floatingly move and the semiconductor element 12 is no longer supported by the hanging mechanism 102. Since the semiconductor element 12 has a specific gravity smaller than the specific gravity of the molten solder the semiconductor element floats on the molten solder. Therefore, even if the hanging mechanism 102 is further lowered in excess of a position at which the semiconductor element 12 is floating, the semiconductor element 12 does not receive any force from the hanging mechanism 102 and is maintained in a floating position.

Therefore, the lower surface of the semiconductor element 12 becomes just parallel to the surface of the molten solder in the molten-solder vessel 84, and the molten solder is uniformly transferred onto the gold bump elements 62.

Figure 24:
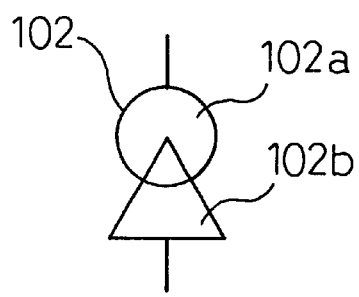
FIG. 24 is a view illustrating a modified example of the hanging mechanism.
Figure 25:
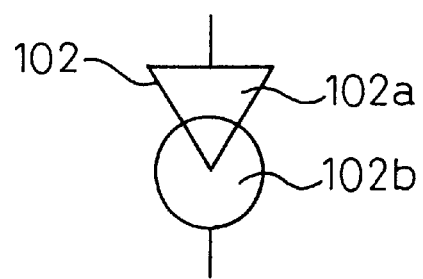
FIG. 25 is a view illustrating another modified example of the hanging mechanism.
Figure 26:
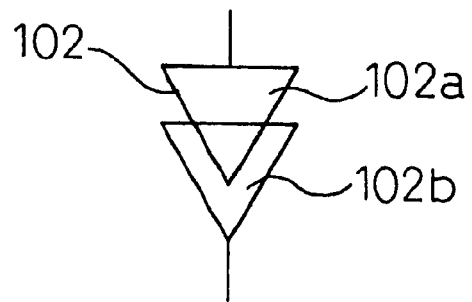
FIG. 26 is a view illustrating a further modified example of the hanging mechanism.

FIGS. 24 to 26 illustrate modified examples of the hanging mechanism 102. In FIG. 23, the two coupling members 102a and 102b are formed as circular rings. In FIG. 24, the upper coupling member 102a is formed as a circular ring, and the lower coupling member 102b is formed as a triangular ring.

In FIG. 25, the upper coupling member 102a is formed as a triangular ring, and the lower coupling member 102b is formed as a circular ring. In FIG. 26, the two coupling members 102a and 102b are both formed as triangular rings.

Figure 27:
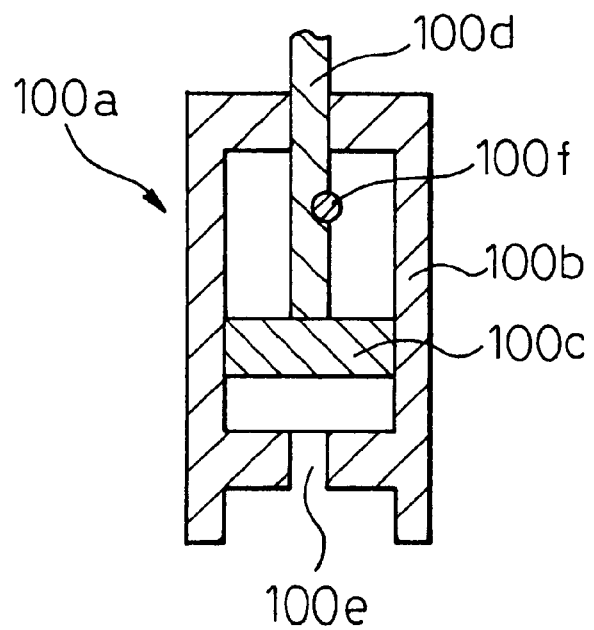
FIG. 27 is a cross-sectional view illustrating an example of the pump-type suction head.
Figure 28:
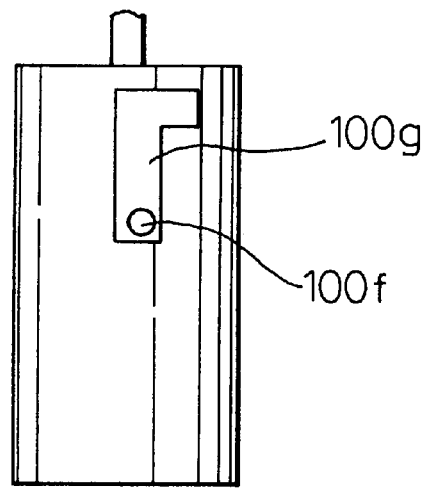
FIG. 28 is a side view of the suction head of FIG. 27.
Figure 29:
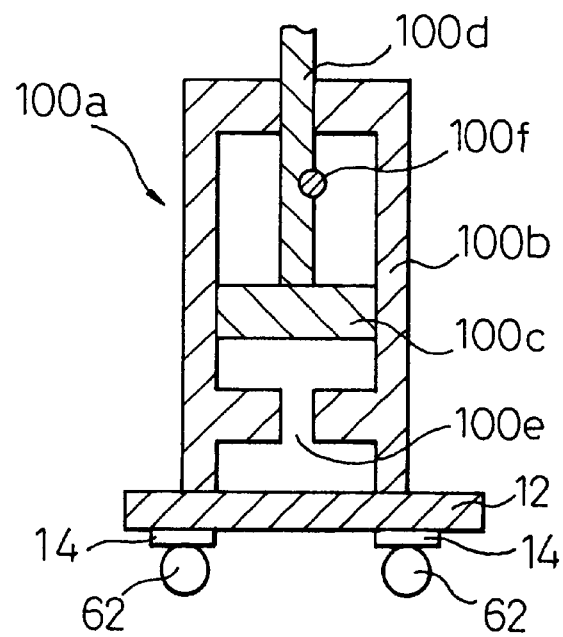
FIG. 29 is a cross-sectional view of the suction head of FIG. 27 with the semiconductor element supported thereby.

FIGS. 27 to 29 illustrate an embodiment of the pump-type suction head. The suction support device 90 of FIG. 23 has the suction head 100 which is evacuated through the vacuum hose 104. The pump-type suction head 100a shown in FIGS. 27 to 29 independently creates vacuum without the need of connecting the vacuum hose 104. The suction head 100a has a case 100b, a piston 100c and a piston rod 100d. The piston rod 100d protrudes from an end of the case 100b, and a suction hole 100e is formed in the other end of the case 100b. The piston rod 100d is provided with an engaging projection 100f which is inserted in an engaging hole 100f of an inverse L-shape formed in the outer periphery of the case 100b.

Referring to FIG. 29, when the piston rod 100d is pulled with the semiconductor element 12 being brought to one end of the suction head 100a, the piston 100c rises in the case 100b, whereby a vacuum is created in the case 100b and the semiconductor element 12 is held by the suction head 100a. The engaging projection 100f that arrives at the vertex of the engaging hole 100f of the inverse L-shape together with the piston rod 100d, enters into a horizontal portion of the engaging hole 100f of the inverse L-shape. Therefore, the suction head 100a is maintained at a position of holding the semiconductor element 12. The suction head 100a can be used together with the hanging mechanism 102 of FIG. 23 or together with any other hanging mechanism or support mechanism.

Figure 30:
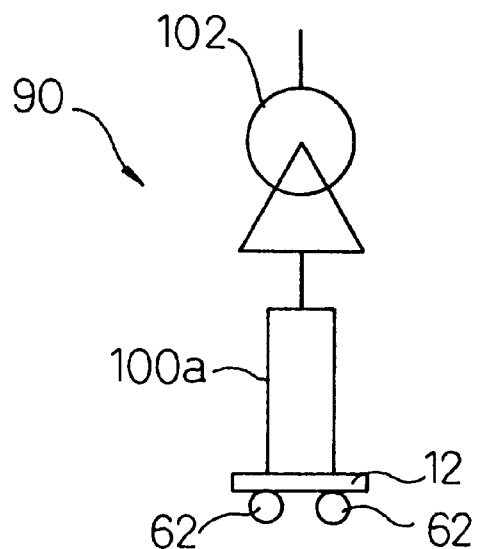
FIG. 30 is a view illustrating a modified example of the suction support device.
Figure 31:
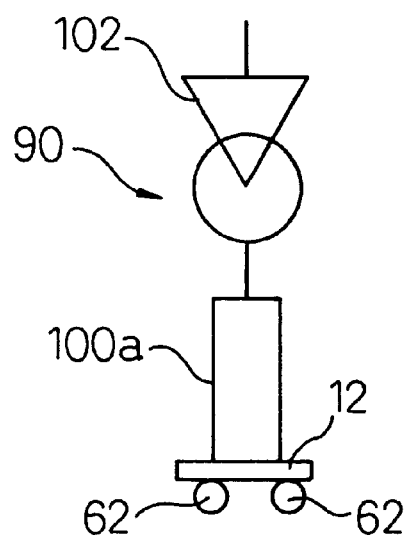
FIG. 31 is a view illustrating another modified example of the suction support device.
Figure 32:
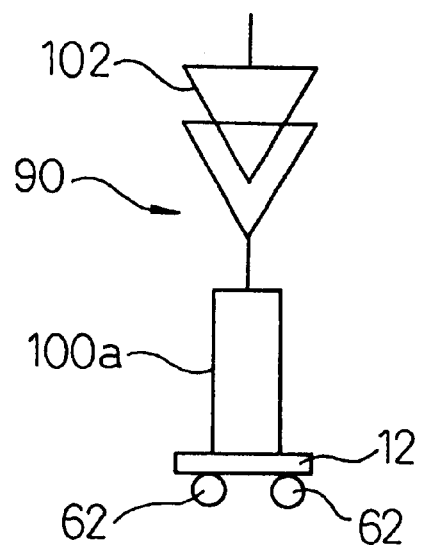
FIG. 32 is a view illustrating a further modified example of the suction support device.

FIGS. 30 to 32 illustrate examples where the suction head 100a is used together with the hanging mechanisms 102 of FIGS. 24 to 26.

The solder films can be formed on the gold bumps 62 attached to the electrodes 14 of the semiconductor element 12, not only by immersing the gold bumps 62 in the molten solder, but also by vaporizing and depositing the solder onto the gold bumps 62 as the solder films.

Figure 33:
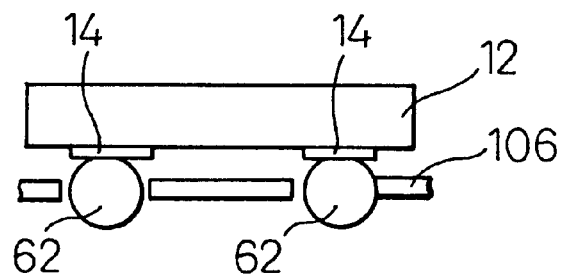
FIG. 33 is a view illustrating a step in a process for forming solder bump elements on the gold bump elements by vaporization.
Figure 34:
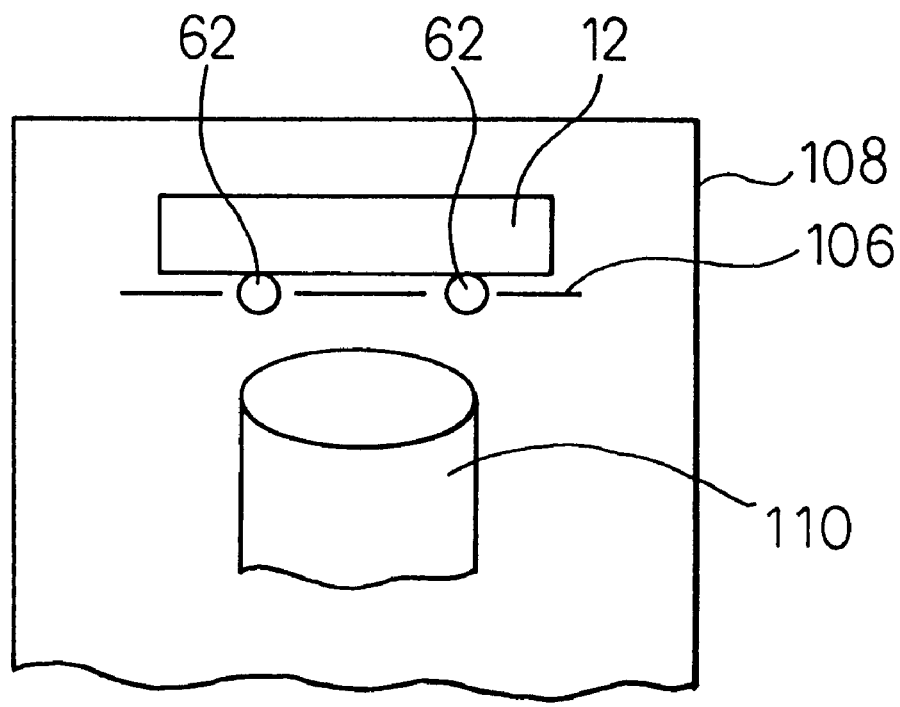
FIG. 34 is a view illustrating a step that follows the step of FIG. 33.

FIGS. 33 and 34 illustrate an example where the solder films are being vaporized onto the gold bumps 62. In this case, a mask 106 having openings for exposing only the gold bumps 62 attached to the electrodes 14 of the semiconductor element 12 is used. The semiconductor element 12 with the mask 106 is introduced into a vacuum chamber 108, and a target 110 is heated so that the solder vapor adheres onto the gold bumps 62. Thus, the solder films are deposited onto the gold bumps 62.

As described above, the present invention provides a semiconductor device and a method and an apparatus for producing the same which enable a semiconductor element to be mounted to the wiring board by a face-down technique and which provide for improved reliability in the connecting portions and simplicity of the replacement of the semiconductor element.

What is claimed is:

1. A semiconductor device comprising a semiconductor element having electrodes, and metal bumps including cores and metal surface layers covering said cores, each of said metal surface layers covering all over an outer surface of each of said cores, said metal bumps being attached to the electrodes of said semiconductor element wherein said core comprises one of an inorganic material and an organic material and has a diameter of not larger than 100 µm, and said metal surface layer has a thickness of not larger than 50 µm, the cores being harder than the surface layers.

2. A semiconductor device according to claim 1, wherein said metal surface layer comprises one of gold and solder.

3. A semiconductor device according to claim 1, wherein said metal surface layer is a plated layer plated on said core.

4. A semiconductor device according to claim 1, wherein said core comprises one of a metal, an inorganic material and an organic material and has a diameter of not larger than 100 µm, and said metal surface layer has a thickness of not larger than 50 µm.

5. A semiconductor device according to claim 1, further comprising a wiring board having electrodes, said metal bumps attached to the electrodes of said semiconductor element being connected to the electrodes of said wiring board.

6. A semiconductor device comprising a semiconductor element having electrodes, and metal bumps comprising gold-containing solder films formed on the electrodes of said semiconductor element and metal bump elements provided on said gold-containing solder films, said gold containing-solder films comprising a gold-containing alloy.

7. A semiconductor device according to claim 6, further comprising a wiring board having electrodes, the metal bumps attached to the electrodes of said semiconductor element being connected to the electrodes of said wiring board.

8. A semiconductor device according to claim 6, wherein said metal bump element comprises one of gold and solder.

9. A semiconductor device according to claim 6, wherein said metal bump element is formed as one of a metal film and a metal ball.

* * * * *